(12) United States Patent
Yamashita

(10) Patent No.: US 6,872,512 B2  
(45) Date of Patent: Mar. 29, 2005

(54) METHOD OF FORMING RESIST PATTERN

(75) Inventor: Masami Yamashita, Izumi (JP)

(73) Assignee: NEC LCD Technologies, Ltd. (JP)

( * ) Notice: Subject to any disclaimer, the term of this patent is extended or adjusted under 35 U.S.C. 154(b) by 186 days.

(21) Appl. No.: 10/400,860

(22) Filed: Mar. 27, 2003

(65) Prior Publication Data

US 2003/0186170 A1 Oct. 2, 2003

(30) Foreign Application Priority Data

Mar. 27, 2002 (JP) ........................................ 2002-087297

(51) Int. Cl.$^7$ ............................................. G03F 7/00
(52) U.S. Cl. ..................................... 430/322; 427/273
(58) Field of Search ................................ 430/322–325; 427/273

(56) References Cited

U.S. PATENT DOCUMENTS

| | | | |
|---|---|---|---|
| 4,022,932 A | * 5/1977 | Feng ........................... 430/296 |
| 5,133,840 A | * 7/1992 | Buchwalter et al. ........ 205/167 |
| 6,599,582 B2 | * 7/2003 | Kiguchi et al. ............. 427/466 |
| 2002/0027300 A1 | * 3/2002 | Hartmann et al. ........... 264/1.1 |

* cited by examiner

Primary Examiner—Mark F Huff
Assistant Examiner—Kripa Sagar
(74) Attorney, Agent, or Firm—Hayes Soloway P.C.

(57) ABSTRACT

A method of forming a resist pattern effectively controls the manner/style and the amount of modification of a resist pattern in its reflowing process, realizing a desired resist pattern with a desired accuracy even if the deformation amount of the resist pattern is increased in the reflowing process. A second layer is formed on a first layer and then, a first resist pattern is formed on the second layer. The second layer is selectively etched using the first resist pattern as a mask. Thereafter, wettability of at least part of an exposed area of the second or first layer from the first resist pattern is adjusted, thereby forming a wettability-adjusted part. The first resist pattern is modified in such a way as to extend to the wettability-adjusted area by reflowing the first resist pattern using an organic solvent, thereby forming a second resist pattern for selectively etching the first layer or the second layer.

20 Claims, 4 Drawing Sheets

FIG. 1A
PRIOR ART

INITIAL RESIST PATTERN 101

102 BASE MATERIAL OR LAYER

FIG. 1B
PRIOR ART

MODIFIED RESIST PATTERN 101a

METHOD OF FORMING RESIST PATTERN

BACKGROUND OF THE INVENTION

1. Field of the Invention

The present invention relates generally to a method of forming a resist pattern. More particularly, the invention relates to a method of forming a resist pattern or a patterned resist layer using its reflow phenomenon or behavior, which is preferably used in a lithography process for forming a minute shape or profile in semiconductor device fabrication.

2. Description of the Related Art

In recent years, the trend to increase the integration scale and the performance of semiconductor devices, i.e., Large-Scale Integrated circuit devices (LSIs), has been progressing rapidly. According to this trend, how to suppress the rising fabrication cost has become an important problem to be solved.

In response, an improved method of forming a pattern was developed and disclosed so far, which is capable of reducing the count of necessary processes to thereby lower the fabrication cost. In this improved method, a first etching process is carried out using a resist pattern as a mask. Then, the resist pattern is modified by heating due to its "reflow" phenomenon, in other words, the pattern is heated in such a way as to soften and reflow, resulting in a modification of the pattern. Subsequently, a second etching process is carried out using the resist pattern thus modified as a mask, thereby forming a desired shape or profile. This method, which is termed the "resist reflow" method, has an advantage that the count of necessary processes is reduced. This is because the first and second etching processes can be carried out with substantially the same resist pattern, in other words, a single lithography process is necessary for conducting the first and second etching processes.

Figure 1A:
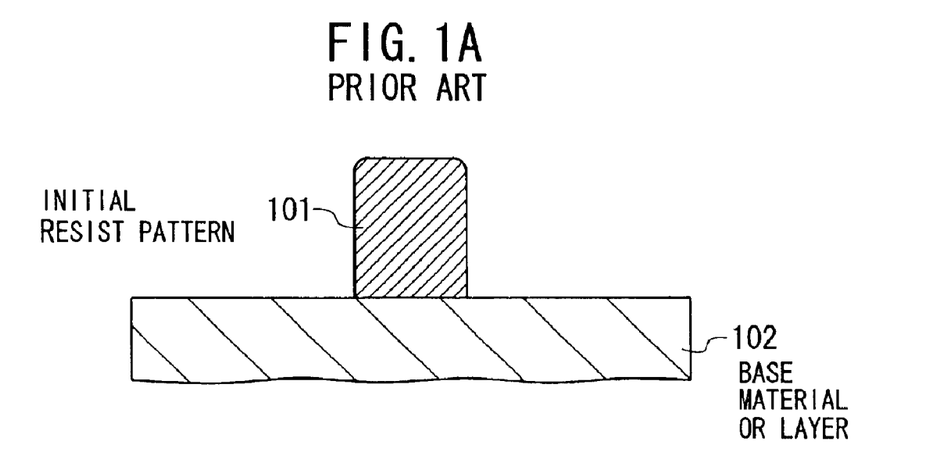
FIGS. 1A and 1B are schematic cross-sectional views showing the concept of a prior-art resist reflow method, respectively.
Figure 1B:
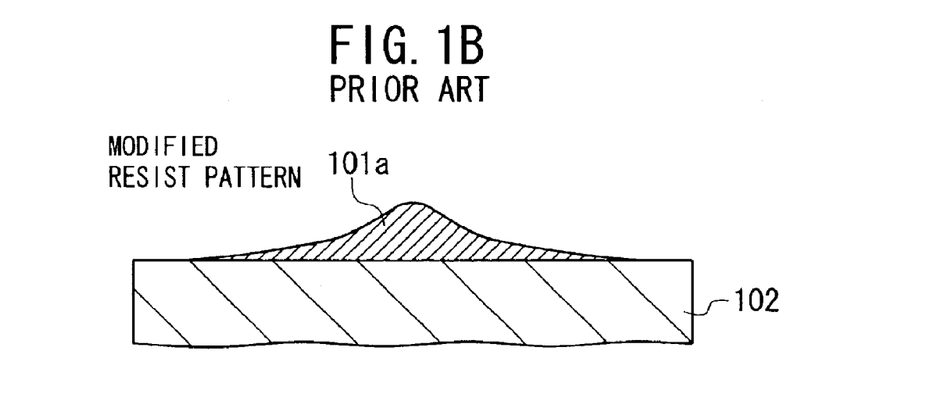

FIGS. 1A and 1B show the concept of the prior-art resist reflow method described above. FIGS. 1A and 1B are schematic cross-sectional views before and after the reflowing process, respectively.

First, as shown in FIG. 1A, a resist pattern (i.e., a patterned resist layer) 101 having a specific shape is formed on a base material or layer 102. The pattern 101 is typically formed by pattering a resist layer made of an appropriate resist material. The pattern 101 is used as a mask in a subsequent first etching process (not explained here).

After the first etching process using the pattern 101 is completed, a solvent is penetrated into the resist pattern 101 by way of its surface by exposing the pattern 101 to a vapor of a soluble solvent or the like. In this stage, the viscosity of the pattern 101 lowers due to penetration or absorption of the solvent and therefore, the pattern 101 softens and reflows. This reflowing behavior of the pattern 101 progresses in a most stable form with respect to energy under the effects of the surface tension, the re-volatilization of the solvent penetrated into the pattern 101, and the wettability of the underlying surface (i.e., the surface of the base material or layer 102). When the pattern 101 is modified to have a desired shape due to the reflowing behavior, the exposure of the pattern 101 to the vapor is stopped and a drying process for drying the solvent penetrated into the pattern 101 is conducted, thereby stopping the modification of the pattern 101. Thus, the reflowing process of the pattern 101 is completed. As a result, as shown in FIG. 1B, a modified resist pattern 101a is formed on the base material or layer 102. This pattern 101a is used as a mask in a subsequent second etching process (not explained here).

The modified resist pattern 101a shown in FIG. 1B is considerably different in shape (i.e., outer form) from the initial resist pattern 101 shown in FIG. 1A. However, by properly adjusting the condition for the reflowing process, the level or degree of modification of the initial pattern 101 is changeable according to the necessity.

Figure 2A:
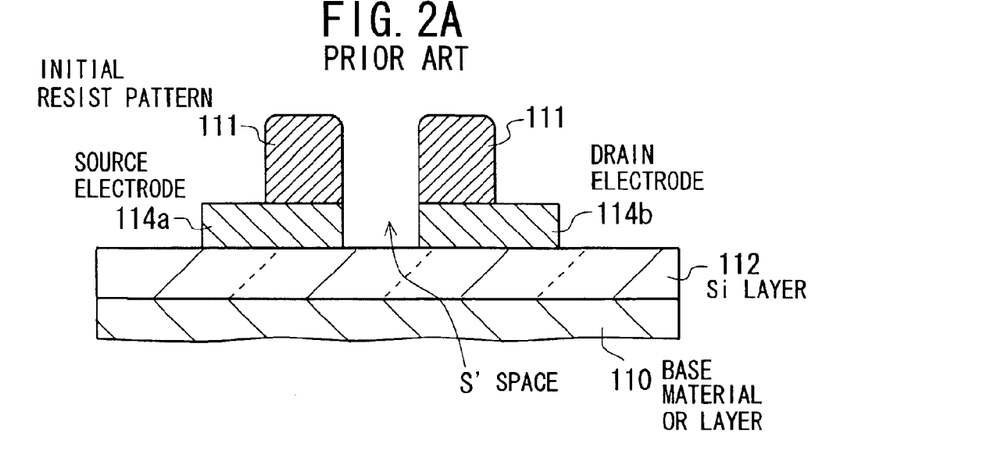
FIGS. 2A to 2C are schematic cross-sectional views showing an application example of the prior-art resist reflow method shown in FIGS. 1A and 1B, respectively.
Figure 2B:
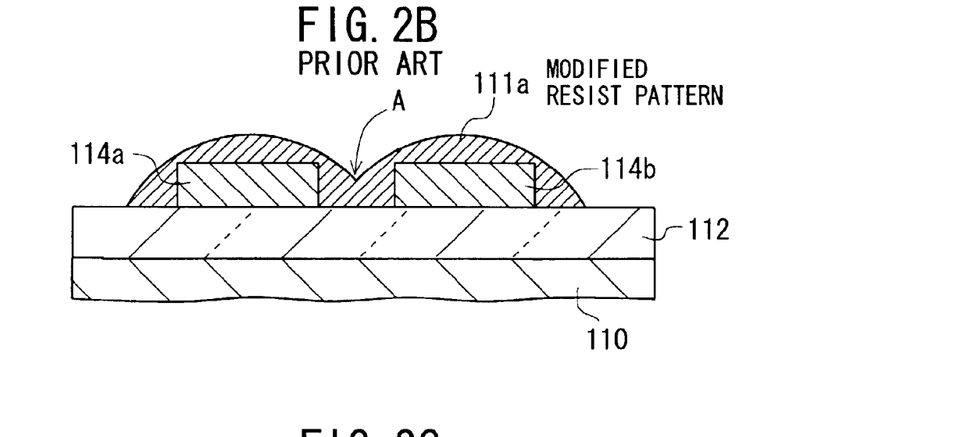
Figure 2C:
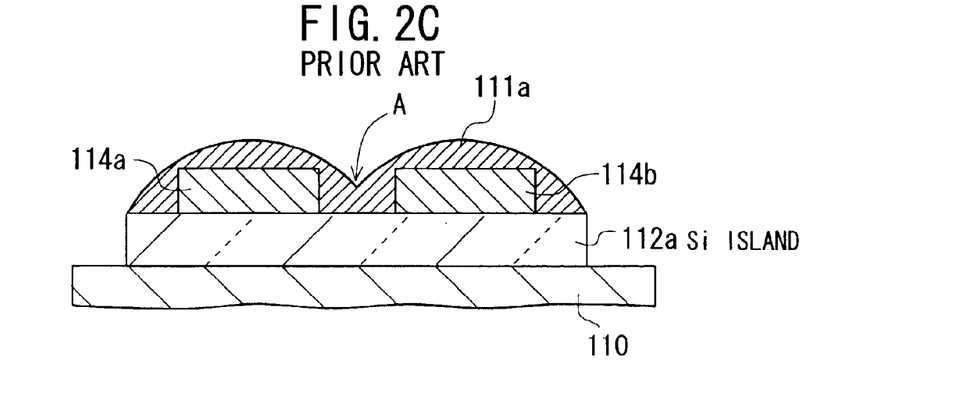

FIGS. 2A to 2C show an application example of the prior-art resist reflow method as shown in FIGS. 1A and 1B, in which the method is applied to the fabrication of a Field-Effect Transistor (FET). FIG. 2A is a schematic cross-sectional view after the first etching process and before the reflowing process, FIG. 2B is a schematic cross-sectional view after the reflowing process, and FIG. 2C is a schematic cross-sectional view after the second etching process.

As shown in FIG. 2A, a single-crystal or polycrystalline silicon (Si) layer 112 is formed on a dielectric base material or a dielectric layer 110. A source electrode 114a and a drain electrode 114b are formed on the Si layer 112 to be apart from each other at a distance, forming a space S' between the electrodes 114a and 114b. These electrodes 114a and 114b are formed by patterning a chromium (Cr) layer.

An initial resist pattern or a patterned resist layer 111 is formed on the source and drain electrodes 114a and 114b. This pattern 111 is obtained by narrowing the width of its original resist pattern (not shown) used for forming the electrodes 114a and 114b. This narrowing process is conducted by a known method and thus, no explanation is presented here. The initial pattern 111 has an opening to be overlapped with the underlying space S'.

A reflowing process of the initial resist pattern 111 is carried out from the state of FIG. 2A. This reflowing process is realized by penetrating a solvent into the resist pattern 111 by way of its surface by exposing the pattern 111 to a vapor of a soluble solvent or the like. In this process, the viscosity of the initial pattern 111 lowers due to penetration of the solvent and therefore, the pattern 111 softens and reflows gradually in a most stable form with respect to energy under the effects of the surface tension, the re-volatilization of the solvent penetrated into the pattern 111, and the wettability of the underlying surface (i.e., the surface of the underlying Si layer 112). As a result, the shape of the pattern 111 is modified to expand horizontally.

When the initial resist pattern 111 is modified to have a desired shape due to the reflowing behavior, the exposure of the pattern 111 to the vapor is stopped and a drying process for drying the solvent penetrated into the pattern 111 is conducted, thereby stopping the modification of the pattern 111. Thus, the reflowing process is completed. As a result, as shown in FIG. 2B, a modified resist pattern 111a is formed on the Si layer 112.

As seen from FIG. 2B, the modified resist pattern 111a is expanded horizontally in such a way as to contact the surface of the Si layer 112 and to entirely cover the source and drain electrodes 114a and 114b. The pattern 111a has a varying thickness according to the profile on the surface of the layer 112. In other words, the pattern 111a has a less thickness uniformity. The depressed part A of the pattern 111a, which is located between the electrodes 114a and 114b, has a relatively smaller thickness.

Following this, a subsequent second etching process for the underlying Si layer 112 is carried out by dry etching using the modified resist pattern 111a as a mask. Thus, the Si layer 112 is selectively etched, thereby forming a Si island 112a on the surface of the base material or layer 110. At this time, the source and drain electrodes 114a and 114b are located on the Si island 112a. The state at this stage is shown in FIG. 2C.

With the above-described prior-art method of forming a resist pattern shown in FIGS. 2A to 2C, however, the surface of the initial resist pattern 111 continues to absorb the solvent and soften during the reflowing process. Moreover, as the reflowing behavior of the pattern 111 advances, the vapor of the solvent to be adhered to the underlying surfaces of the pattern 111 will increase and as a result, the wettability of these surfaces to the pattern 111 will improve or rise. In this way, the more the reflowing behavior advances, the higher the reflowing rate of the pattern 111 rapidly. Accordingly, there is a disadvantage that accurate formation of the modified resist pattern 111a as desired is difficult and that the in-plane uniformity of the quality of the modified pattern 111a is lowered.

Taking the said disadvantage into consideration, to raise or improve the accuracy and uniformity of the modified resist pattern 111a, it is necessary for the above-described prior-art method shown in FIGS. 2A to 2C to complete or finish the reflowing process in such a way that the degree or level of modification of the initial pattern 111 does not exceed a certain value. This means that the initial resist pattern 111 is unable to be modified to a pattern widely different from the said pattern 111. In addition, since only the surfaces of the pattern 111 dissolves in an early stage of the reflowing process, the extended parts of the modified pattern 111a will be thinner than the remaining part thereof. Thus, the extended parts will have an insufficient resistance property against dry etching used in the second etching process.

On the other hand, another method using a bank or embankment can be thought to raise the accuracy of the modified resist pattern 111a. In this method, a bank or embankment is formed in the preceding patterning process of the underlying layer or material to the reflowing process in such a way as to block the excessive extension of the dissolving or softening pattern 111 in the subsequent reflowing process. However, this method is not preferred, because the shape or pattern of the underlying layer or material is restricted by the formation of the bank or embankment.

SUMMARY OF THE INVENTION

Accordingly, an object of the present invention is to provide a method of forming a resist pattern that effectively controls the manner or style and the amount of modification of a resist pattern in its reflowing process.

Another object of the present invention is to provide a method of forming a resist pattern that realizes a desired resist pattern with a desired accuracy even if the amount of deformation of a resist pattern is increased in its reflowing process.

Still another object of the present invention is to provide a method of forming a resist pattern that avoids the degradation of a dry-etching resistance property of a modified resist pattern obtained through a reflowing process.

A further object of the present invention is to provide a method of forming a resist pattern that applies no bad effect to an underlying layer or material of a resist pattern to be modified after a reflowing process.

The above objects together with others not specifically mentioned will become clear to those skilled in the art from the following description.

A method of forming a resist pattern according to a first aspect of the present invention comprises:

forming a second layer on a first layer;

forming an initial resist pattern on the second layer;

adjusting a wettability of a desired exposed area of the second layer and/or the first layer, thereby forming a wettability-adjusted area; and modifying the initial resist pattern in such a way as to extend to the wettability-adjusted area by reflowing the initial resist pattern using an organic solvent, thereby forming a modified resist pattern.

When a reflowing behavior of a resist pattern is utilized in a photolithography process used for forming a minute shape or profile of a semiconductor device, the resultant shape of a modified resist pattern (i.e., a post-reflow resist pattern) is determined by how the initial resist pattern dissolves during the reflowing process. Therefore, to obtain a desired modified resist pattern, it is essential to effectively control the speed or rate of the reflowing behavior of the initial resist pattern.

With the method according to the first aspect of the present invention, a wettability of a desired exposed area of the second layer and/or the first layer is adjusted to thereby form a wettability-adjusted area. Thereafter, the initial resist pattern is modified in such a way as to extend to the wettability-adjusted area by reflowing the initial resist pattern using an organic solvent, thereby forming a modified resist pattern.

Therefore, because of the "wettability adjustment" of the desired exposed area of the second and/or first layer (i.e., the wettability-adjusted area), the manner or style and the amount of modification of the initial resist pattern is effectively controlled in the reflowing process. As a result, the modified resist pattern with a desired accuracy can be obtained as desired even if the amount of deformation of the initial resist pattern is increased in the reflowing process.

Moreover, since the reflowing rate of the initial resist pattern is prevented from rising abnormally due to the "wettability adjustment", not only the outer part of the initial resist pattern but also the inner part thereof can be dissolved sufficiently by the organic solvent. This means that the modified resist pattern will not have a thin extended part, in other words, the modified resist pattern will have an improved thickness uniformity. As a result, resistance degradation of the modified resist pattern against dry etching is avoided.

In addition, since degradation of the dry-etching resistance property of the modified resist pattern is avoided, no bad effect is applied to the underlying first and/or second layer(s) of the modified resist pattern after the reflowing process.

In a preferred embodiment of the method according to the first aspect, the wettability-adjusted area includes a first sub-area having an increased wettability and a second sub-area having a decreased wettability. In this embodiment, it is preferred that the wettability increase of the first sub-area and the wettability decrease of the second sub-area are generated according to their underlying layers or materials. It is preferred that the first sub-area is located in a place where a desired deformation of the initial resist pattern is relatively large and the second sub-area is located in a place where a desired deformation of the initial resist pattern is relatively small. In these embodiments, there is an additional advantage that the modified resist pattern having a desired shape or profile is easily obtainable.

In another preferred embodiment of the method according to the first aspect, the step of adjusting a wettability of the desired exposed area is carried out by a plasma treatment. In this embodiment, there is an additional advantage that the method of the invention is carried out easily. It is preferred that a mixture of $CHF_3$ and $O_2$ is used as a gas for wettability adjustment in the plasma treatment. Alternately, it is preferred that the plasma treatment is carried out in a first step where CHF$_3$ is used as a gas for wettability adjustment and in a second step where O$_2$ is used as a gas for wettability adjustment.

In still another preferred embodiment of the method according to the first aspect, the step of modifying the initial resist pattern is carried out by exposing the initial resist pattern to a vapor of the organic solvent to thereby penetrate the solvent into the initial resist pattern, or immersing the initial resist pattern into the organic solvent to thereby penetrate the solvent into the initial resist pattern.

A method of forming a resist pattern according to a second aspect of the present invention comprises:

forming an initial resist pattern on a layer or material;

adjusting a wettability of a desired exposed area of the layer or material, thereby forming a wettability-adjusted area; and reflowing the initial resist pattern by penetration of an organic solvent in such a way as to expand to the wettability-adjusted area, thereby forming a modified resist pattern.

With the method according to the second aspect of the present invention, a wettability of a desired exposed area of the layer or material is adjusted to thereby form a wettability-adjusted area. Thereafter, the initial resist pattern is modified in such a way as to extend to the wettability-adjusted area by reflowing the initial resist pattern by penetration of an organic solvent, thereby forming a modified resist pattern.

Therefore, because of the "wettability adjustment" of the desired exposed area of the layer or material, the manner or style and the amount of modification of the initial resist pattern is effectively controlled in the reflowing process. As a result, the modified resist pattern with a desired accuracy can be obtained as desired even if the amount of deformation of the initial resist pattern is increased in the reflowing process.

Moreover, since the reflowing rate of the initial resist pattern is prevented from rising abnormally due to the "wettability adjustment", not only the outer part of the initial resist pattern but also the inner part thereof can be dissolved sufficiently by the organic solvent. This means that the modified resist pattern will not have a thin extended part, in other words, the modified resist pattern will have an improved thickness uniformity. As a result, resistance degradation of the modified resist pattern against dry etching is avoided.

In addition, since degradation of a dry-etching resistance property of the modified resist pattern is avoided, no bad effect is applied to the layer or material after the reflowing process.

Preferably, at least one selected from the group consisting of alcohols, ethers, esters, ketones, and glycol ethers is used as the organic solvent in the methods of the first and second aspects.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

First Embodiment

Figure 3A:
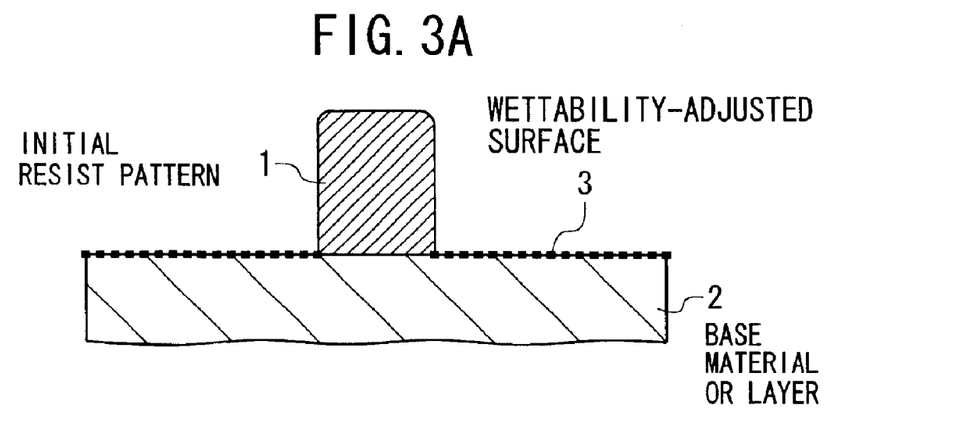
FIGS. 3A and 3B are schematic cross-sectional views showing a method of forming a resist pattern according to a first embodiment, respectively.
Figure 3B:
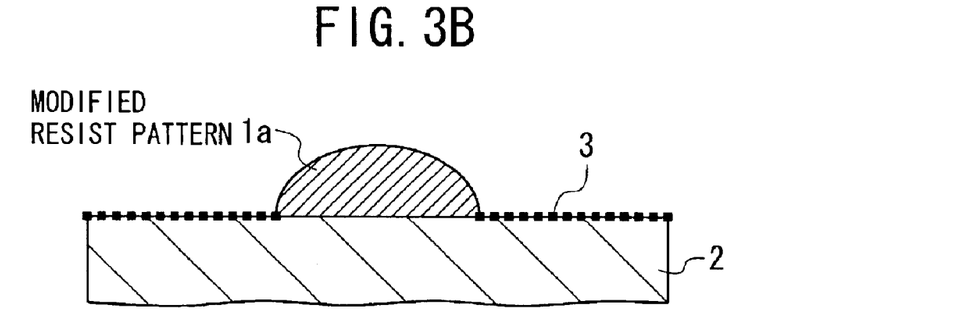

A method of forming a resist pattern according to a first embodiment of the invention is shown in FIGS. 3A and 3B. FIG. 3A shows the state before a reflowing process and FIG. 3B shows the state after the reflowing process.

First, as shown in FIG. 3A, an initial resist pattern 1 with a specific shape is formed on a base material or layer 2 by a known method. This pattern 1 is used as a mask for a first etching process.

Next, a surface treatment is carried out to adjust the "wettability" of the exposed surface 3 of the underlying base material or layer 2. Thus, the wettability of the exposed surface 3 is adjusted, in other words, the wettability of the exposed surface 3 is decreased or increased according to the necessity. The state at this stage is shown in FIG. 3A.

Generally, whether the wettability of a surface is good or bad is evaluated by using a "contact angle". Here, the "contact angle" of a liquid drop contacting the surface of a solid at a contact point is defined as an angle between a tangent of the drop formed at the contact point and the solid surface. If the "contact angle" is small, the wettability of the surface is evaluated good. In this case, a fluid material will flow well on the solid surface along the same, and an obtainable adhesion strength of the material after solidification to the solid surface is high. Currently, appropriate surface-treatment processes under various conditions have already been developed for almost all known materials and at the same time, various surface-treatment processes have been developed for improving the wettability of a desired solid surface.

For example, one of dry and easy-handled surface-treatment processes is a process utilizing plasma, i.e., a plasma process. In this process, plasma is generated in a vacuum or in the atmospheric air to thereby activate a gaseous substance and then, an object to be processed (e.g., the exposed surface 3 of the material or layer 2) is contacted with the substance thus activated. On the other hand, one of wet surface-treatment processes is a "wet cleaning process", where an object to be processed is immersed in or contacted with a liquid containing a proper surfactant or surface-active agent. In this process, cleaning and drying steps are necessary after the immersing step and therefore, there is a disadvantage of an increased count of necessary steps and an extended time for treatment. Therefore, the dry surface-treatment processes are more preferred than the wet ones. These processes are applicable to raising or lowering of the surface wettability.

To lower or decrease the wettability, the following method is applicable. Specifically, an object, the surface of which has been treated, is placed for a specific time in a controlled space whose parameters such as temperature, humidity, atmosphere, and dust are well controlled or managed.

After an appropriate surface-treatment for adjusting (i.e., raising or lowering) the wettability of the exposed surface 3 of the material or layer 2 is completed, the resist pattern 1 is exposed to the vapor of a suitable organic solvent in which the pattern 1 is soluble, thereby penetrating the solvent into the pattern 1 by way of its surface. Because of penetration of the solvent into the pattern 1, the pattern 1 softens and flows. Thus, the shape of the initial pattern 1 is modified due to its reflowing behavior, in other words, the pattern 1 extends horizontally over the wettability-adjusted surface 3 of the base material or layer 2 along the same. When the pattern 1 is modified to have a desired shape, the modification of the pattern 1 is stopped by stopping the exposure of the pattern 1 to the vapor and drying the said pattern 1. In this way, the reflowing process for the initial pattern 1 is completed. The state at this stage is shown in FIG. 3B. As seen from FIG. 3B, a modified resist pattern 1a whose width is increased and whose height is decreased is formed on the surface 3 of the material 2. The surface of the pattern 1a is round, which is unlike the initial pattern 1 with a rectangular cross-section.

Regarding the conditions of the reflowing process, for example, when the initial resist pattern 1 is made of a novolac resin, it is preferred that N-methyl-2-pyrrolidone (NMP) is used as the organic solvent, the processing pressure is set at a value in the range from −80 kPa to +10 kPa, and the processing time is set at a value in the range from 3 minutes to 10 minutes.

The initial resist pattern 1, the viscosity of which has been lowered or reduced due to absorption of the NMP as the solvent, softens and reflows. The reflowing behavior of the pattern 1 progresses in a most stable form with respect to energy under the effects of the surface tension, the re-volatilization of the NMP penetrated into the pattern 1, and the wettability of the underlying surface (i.e., the surface 3 of the base material or layer 2). In the minute-scale physical phenomenon like this, physical properties relating to the surface area of an object is dominant rather than the volume and weight of the object. Therefore, if the wettability of the surface 3 is good or high with respect to the initial resist pattern 1 and the solvent (i.e., NMP) used, the reflowing rate of the said pattern 1 rises. If the wettability of the surface 3 is not so good or low with respect to the resist pattern 1 and the solvent (i.e., NMP), the reflowing rate of the pattern 1 lowers. In the first embodiment, the wettability of the surface 3 is optimized by the above-described surface treatment in such a way that the controllability of the reflowing process of the pattern 1 is enhanced or improved.

The first factor that affects the reflowing behavior of the initial pattern 1 is the reflowing conditions, i.e., the kind, concentration, and temperature of the solvent (i.e., NMP) or the like. The second factor that affects the reflowing behavior of the pattern 1 is the kind or type of the pattern 1, and the wettability and cross-sectional shape of the exposed surface 3 of the base material or layer 2 (i.e., the surface of the underlying layer or material of the pattern 1).

With the method of forming a resist pattern according to the first embodiment, as explained above with reference to FIGS. 3A and 3B, the wettability of the exposed surface 3 of the base material or layer 2 is adjusted effectively. Thereafter, the initial resist pattern 1 is modified in such a way as to horizontally extend to or over the wettability-adjusted exposed surface 3 by reflowing the pattern 1 using the organic solvent (i.e., NMP), thereby forming the modified resist pattern 1a. The pattern 1a is used for selectively etching the base material or layer 2 and/or another underlying material or layer.

Therefore, because of the "wettability adjustment" of the exposed surface 3 of the base material or layer 2, the manner or style and the amount of modification of the initial resist pattern 1 is effectively controlled in the reflowing process. As a result, the modified resist pattern 1a with a desired accuracy can be obtained as desired even if the amount of deformation of the initial resist pattern 1 is increased in the reflowing process.

Moreover, since the reflowing rate of the initial pattern 1 is prevented from rising abnormally due to the "wettability adjustment" of the surface 3, not only the outer part of the initial pattern 1 but also the inner part thereof can be dissolved sufficiently by the organic solvent (i.e., NMP). This means that the modified resist pattern 1a will not have a thin extended part, in other words, the pattern 1a will have an improved thickness uniformity. As a result, resistance degradation of the pattern 1a against dry etching is avoided.

In addition, since degradation of the dry-etching resistance property of the modified resist pattern 1a is avoided, no bad effect is applied to the underlying base material 2 after the reflowing process.

Second Embodiment

Figure 4A:
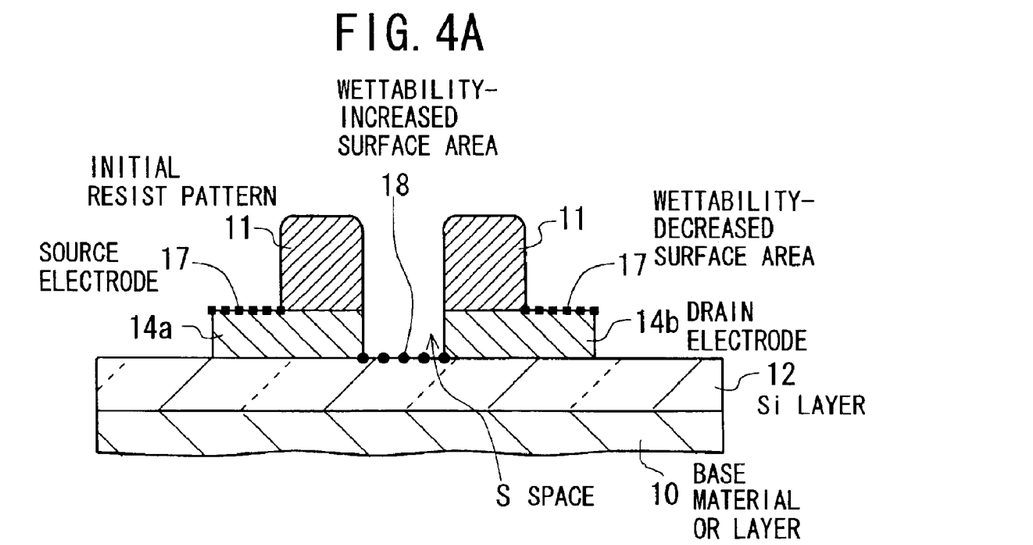
FIGS. 4A to 4C are schematic cross-sectional views showing a method of forming a resist pattern according to a second embodiment, respectively, which is an application example of the method of the first embodiment.
Figure 4B:
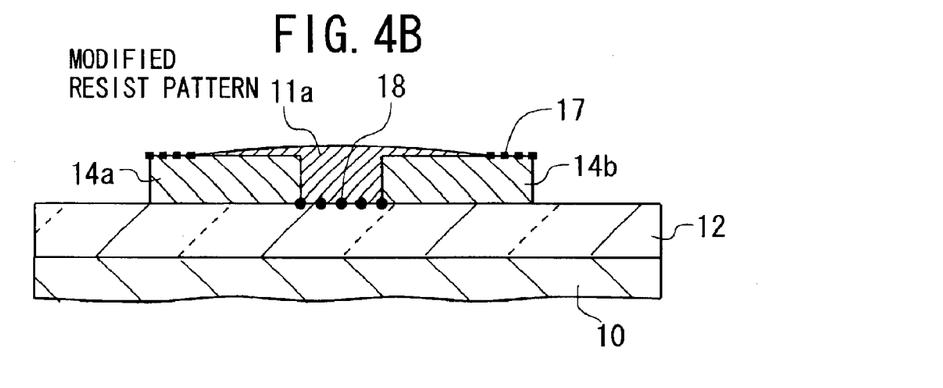
Figure 4C:
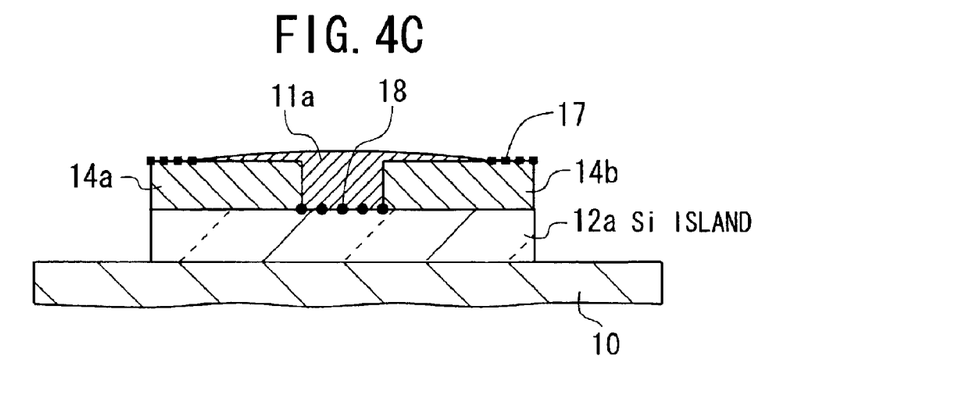

FIGS. 4A to 4C show a method of forming a resist pattern according to a second embodiment of the invention, in which the method of the first embodiment is applied to the fabrication of a FET. FIG. 4A shows the state after the first etching process and before a reflowing process, FIG. 4B shows the state after the reflowing process, and FIG. 4C shows the state after the second etching process.

First, as shown in FIG. 4A, a single-crystal or polycrystalline Si layer 12 is formed on a base material or layer 10. A source electrode 14a and a drain electrode 14b are formed on the Si layer 12 to be apart from each other at a distance, forming a space S between the electrodes 14a and 14b. These electrodes 14a and 14b are formed by patterning a Cr layer.

An initial resist pattern or a patterned resist layer 11 is formed on the source and drain electrodes 14a and 14b. This pattern 11 is obtained by narrowing the width of its original resist pattern (not shown) for forming the electrodes 14a and 14b. This narrowing process is conducted by a known method. The initial pattern 11 has an opening to be overlapped with the underlying space S. The part of the initial resist pattern 11 located on the source electrode 14a has an approximately the same width as the source electrode 14a. Similarly, the part of the initial resist pattern 11 located on the drain electrode 14b has an approximately the same width as the drain electrode 14b.

Next, a surface treatment is carried out to adjust the "wettability" of the exposed surfaces of the source and drain electrodes 14a and 14b and the Si layer 12. Here, the wettability of the exposed surface areas 17 of the source and drain electrodes 14a and 14b (which are made of Cr) are decreased or lowered and at the same time, the wettability of the exposed surface area 18 of the Si layer 12 in the space S between the source and drain electrodes 14a and 14b is increased or enhanced. Thus, the wettability of the necessary surface areas 17 and 18 are adjusted as desired. The state at this stage is shown in FIG. 4A.

In the method according to the second embodiment, the surface-treatment process for adjusting the wettability of the exposed surface areas 17 and 18 is carried out by a plasma treatment. For example, it is effective or preferred that the plasma treatment is carried out by using the mixture of $CHF_3$ and $O_2$ as a wettability-adjustment gas. Alternately, the plasma treatment may be carried out by a two-step process, where $CHF_3$ is used as a wettability-adjustment gas in the first step and $O_2$ is used as the wettability-adjustment gas in the second step.

Actually, the remaining exposed surface area of the Si layer 12 other than the area 18 is affected by the plasma treatment and thus, the wettability of the remaining exposed surface area of the layer 12 is adjusted like the surface area 18. However, the remaining exposed surface area does not contact the initial resist pattern 11 and does not have any relationship with the present invention. Therefore, no explanation about the said surface area is presented here.

Concretely speaking, the plasma process is preferably carried out under the condition that the RF (Radio Frequency) power to be supplied is set at a value ranging from 100 to 300 W, the flow rate of the wettability-adjustment gas is set at a value ranging from 100 to 300 sccm, and the discharge time is set at a value ranging from 10 to 60 sec. In this case, the contact angle with respect to the organic solvent (i.e., NMP), which is a standard for wettability evaluation, is in the range from 1 to 10° in the surface area 18 of the Si layer 12 and in the range from 30 to 50° in the surface areas 17 of the source and drain electrodes 14a and 14b. This means that the wettability of the surface areas 17 is lowered and that of the surface area 18 is raised through the above-described single plasma process.

Preferably, the contact angle of various organic solvents to be penetrated into a resist pattern with respect to its underlying layer(s) or material(s), the effect applied to the resist pattern, and the like are tested and found while changing the plasma condition and the gaseous species used therefor, thereby generating a set of test data. Thereafter, to optimize the wettability of the material of a resist pattern on desired surfaces, different concrete conditions are preferably used for the surface-treatment process for adjusting the wettability based on the set of test data obtained in advance. In summary, it is preferred that desired difference occurs in the contact angle according to the kind or type of underlying layers or materials of the initial resist pattern 11 while the effect applied to the said resist pattern by the surface-treatment process is decreased.

Subsequently, a reflowing process of the initial resist pattern 11 is carried out from the state of FIG. 4A. This reflowing process is realized by penetrating an organic solvent into the resist pattern 11 by way of its surface by exposing the pattern 11 to a vapor of an organic soluble solvent. Regarding the conditions of the reflowing process, for example, when the initial resist pattern 11 is made of a novolac resin, it is preferred that NMP is used as the organic solvent, the processing pressure is set at a value in the range from −80 kPa to +10 kPa, and the processing time is set at a value in the range from 3 minutes to 10 minutes.

In this stage, the viscosity of the initial pattern 11 lowers due to penetration of the solvent and therefore, the pattern 11 softens and reflows gradually in a most stable form with respect to energy under the effects of the surface tension, the re-volatilization of the solvent penetrated into the pattern 11, and the adjusted wettability of the surface areas 17 and 18. As a result, the shape of the initial pattern 11 is modified and expanded horizontally.

As described above, the wettability on the surface areas 17 of the electrodes 14a and 14b (which are made of Cr) is decreased while the wettability on the surface area 18 of the Si layer 12 is increased. Thus, the reflowing behavior of the initial pattern 11 is selectively suppressed on the surface areas 17, which means that the horizontal extension of the pattern 11 on the areas 17 is decreased. At the same time as this, the reflowing behavior of the pattern 11 is selectively promoted on the area 18, which means that the horizontal extension of the pattern 11 on the area 18 is increased.

When the initial resist pattern 11 is modified to have a desired shape of the modified resist pattern 11a due to the reflowing behavior, the exposure of the pattern 11 to the vapor is stopped and a drying process for drying the solvent penetrated into the pattern 11 is conducted, thereby stopping the modification of the pattern 11. Thus, the reflowing process is completed. As a result, as shown in FIG. 4B, a modified resist pattern 11a is formed.

As seen from FIG. 4B, the modified resist pattern 11a covers almost all the surfaces of the source and drain electrodes 14a and all the exposed surface area 18 of the Si layer 12. Because of the wettability adjustment for the areas 17 and 18, it is sure that the modified pattern 11a fills the space between the electrodes 14a and 14b on the area 18 while the pattern 11a does not exceed the outer edges of the electrodes 14a and 14b horizontally.

Following this, a subsequent second etching process for the underlying Si layer 12 is carried out using the modified pattern 11a and the electrodes 14a and 14b as a mask. This is a "dry" etching process. Thus, the Si layer 12 is selectively etched, thereby forming a Si island 12a on the surface of the base material 10. The state at this stage is shown in FIG. 4C.

Unlike the modified resist pattern 111a formed by the prior-art method shown in FIG. 2C, the part of the modified resist pattern 11a between the source and drain electrodes 14a and 14b has a sufficient thickness. This is because the space S between the electrodes 14a and 14b is fully filled with the modified pattern 11a. Specifically, the reflowing behavior of the initial pattern 11 is suppressed on the surface areas 17 and thus, the horizontal extension of the pattern 11 is stopped within the top faces of the electrodes 14a and 14b. On the other hand, the reflowing behavior of the pattern 11 is promoted on the surface area 18 and thus, the horizontal extension of the pattern 11 in the space S is increased. As a result, the surface area 18 of the Si island 12a thus formed is not badly affected by the dry etching action during the second etching process.

With the method of forming a resist pattern according to the second embodiment, as explained above, the wettability of the exposed surface areas 17 of the source and drain electrodes 14a and 14b (which are made of Cr) are decreased or lowered while the wettability of the exposed surface area 18 of the Si layer 12 between the electrodes 14a and 14b is increased or enhanced by the plasma treatment. Therefore, the manner or style and the amount of modification of the initial resist pattern 11 are effectively controlled in the reflowing process of the pattern 11. As a result, the modified resist pattern 11a with a desired accuracy is obtainable as desired even if the amount of deformation of the initial resist pattern 11 is increased in the reflowing process.

Moreover, since the reflowing rate of the initial pattern 11 is prevented from rising abnormally due to the "wettability adjustment", not only the outer part of the initial pattern 11 but also the inner part thereof can be dissolved sufficiently by the organic solvent (i.e., NMP). This means that the modified pattern 11a will not have a thin extended part in the space S between the electrodes 14a and 14b, in other words, the pattern 11a will have an improved thickness uniformity in the space S on the area 18. As a result, resistance degradation of the modified pattern 11a against the dry etching process is avoided.

In addition, since degradation of the dry-etching resistance property of the modified pattern 11a is avoided, no undesired, bad effect is applied to the surface of the Si layer 12 after the reflowing process.

Variations

Needless to say, the present invention is not limited to the above-described first and second embodiments, because they are preferred examples of the invention. Any change or modification may be added to them within the spirit of the invention.

For example, in the above-described first and second embodiments, N-methyl-2-pyrrolidone (NMP) is used as the organic solvent for the reflowing process of the initial resist pattern 1 or 11. However, at least one of alcohols (R—OH), ethers (R—O—R, Ar—O—R, Ar—O—Ar), esters, ketones, and glycol ethers may be used as the organic solvent, where "R" denotes an alkyl group and "Ar" denotes a phenyl group or an aromatic group other than a phenyl group. Concrete examples of the organic solvent for this purpose are as follows:

$CH_3OH$, $C_2H_5OH$, $CH_3(CH_2)XOH$, IPA (isopropyl alcohol), long-chain alkyl esters, acetones, dioxane, acetic ether, butyl acetate, toluene, MEK (methyl ethyl ketone), DMSO (dimethyl sulfoxide), MIBK (methyl isobutyl ketone), butyl carbitol, nBA (n-butyl acetate), γ-butyrolactone, ECA (ethyl cellosolve acetate), ethyl lactate, pyruvate ethyl, MAK (2-heptanone), 3-methoxy butyl acetate, MMP (methyl-3-methoxy propionate), PGME (propylene glycol monomethyl ether), PGMEA (propylene glycol monomethyl ether acetate), PGP (propylene glycol monopropyl ether), PGEE (propylene glycol monoethyl ether), FEP (ethyl-3-ethoxy propionate), dipropylene glycol monoethyl ether, propylene glycol monomethyl ether propionate, 3-methoxy methyl propionate, 3-ethoxy methyl propionate, NMP (N-methyl-2-pyrrolidone)

Moreover, the invention is applied to a method of fabricating a FET in the above-described second embodiment. However, the invention is applicable to fabrication of any other semiconductor device. Needless to say, the invention is applicable to formation of any resist pattern, for example, it is applicable to pattern formation of a photoresist, electron-beam resist, and any other resist.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of forming a resist pattern, comprising:
   forming a second layer on a first layer;
   forming an initial resist pattern on the second layer;
   adjusting a wettability of a desired exposed area of the second layer and/or the first layer, thereby forming a wettability-adjusted area; and
   modifying the initial resist pattern in such a way as to extend to the wettability-adjusted area by reflowing the initial resist pattern using an organic solvent, thereby forming a modified resist pattern.

2. The method according to claim 1, wherein the wettability-adjusted area includes a first sub-area having an increased wettability and a second sub-area having a decreased wettability.

3. The method according to claim 2, wherein the wettability increase of the first sub-area and the wettability decrease of the second sub-area are generated according to their underlying layers or materials.

4. The method according to claim 2, wherein the first sub-area is located in a place where a desired deformation of the initial resist pattern is relatively large and the second sub-area is located in a place where a desired deformation of the initial resist pattern is relatively small.

5. The method according to claim 1, wherein the step of adjusting a wettability of the desired exposed area is carried out by a plasma treatment.

6. The method according to claim 5, wherein a mixture of $CHF_3$ and $O_2$ is used as a gas for wettability adjustment in the plasma treatment.

7. The method according to claim 5, wherein the plasma treatment is carried out in a first step where $CHF_3$ is used as a gas for wettability adjustment and in a second step where $O_2$ is used as a gas for wettability adjustment.

8. The method according to claim 1, wherein the step of modifying the initial resist pattern is carried out by exposing the initial resist pattern to a vapor of the organic solvent to thereby penetrate the solvent into the initial resist pattern.

9. The method according to claim 1, wherein the step of modifying the initial resist pattern is carried out by immersing the initial resist pattern into the organic solvent to thereby penetrate the solvent into the initial resist pattern.

10. The method according to claim 1, wherein at least one of alcohols, ethers, esters, ketones, and glycol ethers is used as the organic solvent.

11. A method of forming a resist pattern, comprising:
    forming an initial resist pattern on a layer or material;
    adjusting a wettability of a desired exposed area of the layer or material, thereby forming a wettability-adjusted area; and
    reflowing the initial resist pattern by penetration of an organic solvent in such a way as to expand to the wettability-adjusted area, thereby forming a modified resist pattern.

12. The method according to claim 11, wherein the wettability-adjusted area includes a first sub-area having an increased wettability and a second sub-area having a decreased wettability.

13. The method according to claim 12, wherein the wettability increase of the first sub-area and the wettability decrease of the second sub-area are generated according to their underlying layers or materials.

14. The method according to claim 12, wherein the first sub-area is located in a place where a desired deformation of the initial resist pattern is relatively large and the second sub-area is located in a place where a desired deformation of the initial resist pattern is relatively small.

15. The method according to claim 11, wherein the step of adjusting a wettability of the desired exposed area is carried out by a plasma treatment.

16. The method according to claim 15, wherein a mixture of $CHF_3$ and $O_2$ is used as a gas for wettability adjustment in the plasma treatment.

17. The method according to claim 15, wherein the plasma treatment is carried out in a first step where $CHF_3$ is used as a gas for wettability adjustment and in a second step where $O_2$ is used as a gas for wettability adjustment.

18. The method according to claim 11, wherein the step of reflowing the initial resist pattern is carried out by exposing the initial resist pattern to a vapor of the organic solvent to thereby penetrate the solvent into the initial resist pattern.

19. The method according to claim 11, wherein the step of reflowing the initial resist pattern is carried out by immersing the initial resist pattern into the organic solvent to thereby penetrate the solvent into the initial resist pattern.

20. The method according to claim 11, wherein at least one of alcohols, ethers, esters, ketones, and glycol ethers is used as the organic solvent.

* * * * *